United States Patent
Leirer et al.

(10) Patent No.: US 10,305,002 B2
(45) Date of Patent: May 28, 2019

(54) LIGHT EMITTING SEMICONDUCTOR DEVICE

(71) Applicant: OSRAM Opto Semiconductors GmbH, Regensburg (DE)

(72) Inventors: Christian Leirer, Friedberg (DE); Markus Maute, Alteglofsheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/121,713

(22) PCT Filed: Jun. 1, 2015

(86) PCT No.: PCT/EP2015/062125
§ 371 (c)(1),
(2) Date: Aug. 25, 2016

(87) PCT Pub. No.: WO2015/189062
PCT Pub. Date: Dec. 17, 2015

(65) Prior Publication Data
US 2017/0125643 A1 May 4, 2017

(30) Foreign Application Priority Data
Jun. 12, 2014 (DE) .................. 10 2014 108 295

(51) Int. Cl.
*H01L 25/16* (2006.01)
*H01L 33/46* (2010.01)
(Continued)

(52) U.S. Cl.
CPC .......... *H01L 33/486* (2013.01); *H01L 25/165* (2013.01); *H01L 25/167* (2013.01);
(Continued)

(58) Field of Classification Search
CPC ... H01L 33/46–33/465; H01L 33/483–33/486; H01L 33/52–33/56; H01L 27/15; H01L 23/60–23/62
See application file for complete search history.

(56) References Cited

U.S. PATENT DOCUMENTS 8,373,188 B2   2/2013  Suh et al.
8,901,592 B2 * 12/2014  Weidner .................. H01L 33/60
                                              257/98
(Continued)

FOREIGN PATENT DOCUMENTS

CN     103053036 A     4/2013
CN     103460414 A    12/2013
(Continued)

*Primary Examiner* — Stephen M Bradley
(74) *Attorney, Agent, or Firm* — Slater Matsil, LLP

(57) ABSTRACT

A light emitting semiconductor device includes at least one light emitting semiconductor chip having a semiconductor layer sequence, a light outcoupling surface, a rear face on an opposite side of the semiconductor layer sequence from the light outcoupling surface, and side faces which connect the light outcoupling surface and the rear face. The light emitting semiconductor device further includes a carrier body, having a molded body which covers the side faces of the at least one light emitting semiconductor chip directly and in a positively-locking manner. The carrier body comprises, at the light outcoupling surface of the at least one light emitting semiconductor chip, a top face on which a dielectric mirror is disposed. At least part of the light outcoupling surface is uncovered by the dielectric mirror.

18 Claims, 2 Drawing Sheets

(51) Int. Cl.
   *H01L 33/48*   (2010.01)
   *H01L 33/54*   (2010.01)
   *H01L 33/60*   (2010.01)
   *H01L 33/62*   (2010.01)
   *H01L 29/861*  (2006.01)

(52) U.S. Cl.
   CPC ............. *H01L 33/46* (2013.01); *H01L 33/54* (2013.01); *H01L 33/60* (2013.01); *H01L 33/62* (2013.01); *H01L 29/861* (2013.01); *H01L 2224/18* (2013.01); *H01L 2224/24137* (2013.01); *H01L 2933/0083* (2013.01)

(56) References Cited

U.S. PATENT DOCUMENTS

| | | | |
|---|---|---|---|
| 9,112,089 | B2 | 8/2015 | von Malm et al. |
| 9,219,208 | B2 * | 12/2015 | Yoon ................. H01L 33/62 |
| 2005/0225730 | A1 * | 10/2005 | Sannohe ............. G02B 5/0833 |
| | | | 353/31 |
| 2006/0023762 | A1 * | 2/2006 | Nishida ............... H01L 25/167 |
| | | | 372/43.01 |
| 2006/0081858 | A1 * | 4/2006 | Lin ...................... H01L 33/46 |
| | | | 257/85 |
| 2008/0067533 | A1 | 3/2008 | Lim et al. |
| 2009/0127573 | A1 * | 5/2009 | Guenther ............. H01L 24/24 |
| | | | 257/98 |
| 2009/0137086 | A1 | 5/2009 | Otremba et al. |
| 2009/0218588 | A1 | 9/2009 | Panaccione et al. |
| 2011/0025190 | A1 * | 2/2011 | Jagt ................... H01L 33/58 |
| | | | 313/499 |
| 2012/0025244 | A1 | 2/2012 | Suh et al. |
| 2013/0062632 | A1 | 3/2013 | Lee |
| 2013/0099276 | A1 | 4/2013 | Fukushima et al. |
| 2014/0014991 | A1 | 1/2014 | Chiu et al. |
| 2014/0070249 | A1 | 3/2014 | Yoon et al. |
| 2015/0041845 | A1 | 2/2015 | Schwarz et al. |
| 2015/0049510 | A1 | 2/2015 | Haiberger et al. |
| 2016/0056343 | A1 | 2/2016 | Weidner et al. |
| 2016/0181491 | A1 | 6/2016 | Sabathil et al. |

FOREIGN PATENT DOCUMENTS

| | | | |
|---|---|---|---|
| DE | 102008057707 A1 | 6/2009 | |
| DE | 102012102114 A1 | 9/2013 | |
| DE | 102012212963 A1 | 2/2014 | |
| WO | 2011015449 A1 | 2/2011 | |
| WO | 2012015153 A2 | 2/2012 | |
| WO | WO 2012034826 A1 * | 3/2012 | ............ H01L 33/60 |
| WO | 2013149772 A1 | 10/2013 | |

* cited by examiner

LIGHT EMITTING SEMICONDUCTOR DEVICE

CROSS-REFERENCE TO RELATED APPLICATIONS

This patent application is a national phase filing under section 371 of PCT/EP2015/062125, filed Jun. 1, 2015, which claims the priority of German patent application 10 2014 108 295.8, filed Jun. 12, 2014, each of which is incorporated herein by reference in its entirety.

TECHNICAL FIELD

A light emitting semiconductor device is specified.

SUMMARY

Particular disclosed embodiments specify a light emitting semiconductor device comprising a light emitting semiconductor chip.

According to at least one embodiment, a light emitting semiconductor device comprises a light emitting semiconductor chip, which comprises a semiconductor layer sequence containing an active region for generating light. The semiconductor layer sequence can be grown particularly preferably on a growth substrate by means of an epitaxy technique, for instance by means of metalorganic vapor phase epitaxy (MOVPE) or molecular beam epitaxy (MBE). The semiconductor layer sequence thereby comprises semiconductor layers that are arranged one above the other along an arrangement direction given by the growth direction. The layers of the semiconductor layer sequence have a main extension plane that is perpendicular to the arrangement direction. Directions parallel to the main extension plane of the semiconductor layers are referred to below as lateral directions.

The light emitting semiconductor chip in particular comprises two main surfaces, which are disposed perpendicular to the growth direction. One of the main surfaces is embodied as a light outcoupling surface, via which is emitted the light generated during operation of the semiconductor device. In addition, the semiconductor chip comprises a rear face, which is on the opposite side from the light outcoupling surface and forms the second main surface of the semiconductor chip. The light outcoupling surface and the rear face are connected together via side faces. In addition to light being emitted by the light outcoupling surface, at least some of the light generated in the active layer during operation may also be emitted via a side face and/or the rear face.

The light emitting semiconductor chip can have a semiconductor layer sequence based on different semiconductor material systems depending on the light to be generated. A semiconductor layer sequence based on $In_xGa_yAl_{1-x-y}As$, for instance, is suitable for a long-wavelength infrared to red emission, a semiconductor layer sequence based on $In_xGa_yAl_{1-x-y}P$, for instance, is suitable for red to yellow radiation, and a semiconductor layer sequence based on $In_xGa_yAl_{1-x-y}N$, for instance, is suitable for short-wavelength visible radiation, i.e. in particular for green to blue radiation, and/or for UV radiation, where $0 \leq x \leq 1$ and $0 \leq y \leq 1$ in each case. In addition, a semiconductor layer sequence based on an antimonide, for example InSb, GaSb, AlSb or a combination thereof, can be suitable for long-wavelength infrared radiation.

The semiconductor layer sequence of the light emitting semiconductor chip can comprise an active region for generating light, for instance a conventional p-n junction, a double heterostructure, a single quantum well structure (SQW structure) or a multi-quantum well structure (MQW structure). In addition to the active region, the semiconductor layer sequence can include further functional layers and functional regions, for instance p-type and n-type charge carrier transport layers, undoped or p-type or n-type confinement, cladding or waveguide layers, barrier layers, planarization layers, buffer layers, protective layers and/or electrodes, and combinations thereof. In particular, for making electrical contact on the light outcoupling surface and on the rear face, the light emitting semiconductor chip can comprise for each case an electrical contact element, for instance in the form of an electrode layer covering a large surface area or a patterned electrode layer. The structures described here relating to the active region or the further functional layers and regions, in particular the design, function and construction thereof, are known to a person skilled in the art and therefore are not described in greater detail here.

The growth substrate can comprise or can be an insulating material or a semiconductor material, for instance an aforementioned compound semiconductor material system. In particular, the growth substrate can comprise or be made of sapphire, GaAs, GaP, GaN, InP, SiC, Si and/or Ge.

The growth process can take place in particular on-wafer. In other words, a growth substrate is provided in the form of a wafer, on which the semiconductor layer sequence is grown over a large area. The grown semiconductor layer sequence can be singulated into individual semiconductor chips in a further method step, in which the side faces of the semiconductor chips can be formed by the singulation.

In addition, the semiconductor layer sequence can be transferred to a carrier substrate prior to singulation, and the growth substrate can be thinned, i.e. removed at least in part or entirely.

According to another embodiment, the light emitting semiconductor device comprises a carrier body, which carries the light emitting semiconductor chip. For this purpose, the carrier body can comprise a molded body, which covers the side faces of the semiconductor chip directly in a positively-locking manner. In particular, the molded body is molded onto the light emitting semiconductor chip and encloses the light emitting semiconductor chip in a lateral direction. In other words, viewed from above onto the light outcoupling surface of the semiconductor chip, the molded body is arranged around the semiconductor chip and in particular is molded onto all the side faces of the light emitting semiconductor chip. In particular, the molded body can be designed such that the light outcoupling surface of the light emitting semiconductor chip is not covered. The side faces of the light emitting semiconductor chip can be covered entirely or, viewed from the rear face, up to a certain height in the direction of the light outcoupling surface, with the result that the molded body has a top face that is set back from the light outcoupling surface for example. More preferably, the side faces can be covered entirely, with the result that the molded body has a top face that is flush with the light outcoupling surface. In addition, the rear face, i.e. in particular the faces of the electrical contact layers that are on the opposite side from the semiconductor layer sequence, can be clear of the molded body. Furthermore, the molded body can also extend by its top face beyond the light outcoupling surface without covering the light outcoupling surface. This can increase the mechanical strength of the carrier body.

In particular, the molded body can comprise a plastics material, preferably a silicone, an epoxy, a hybrid epoxy-silicone material, a polyester, a low melting-point glass or a low melting-point glass ceramic. Here "low melting-point" denotes those glass materials and glass ceramics that can be processed in a molding process at temperatures that will not damage the semiconductor chip. The molded body can also comprise additives such as particles in the plastics material for instance. For example, the molded body can comprise or be made of an epoxy filled with particles such as $SiO_2$ particles for instance. In particular, the molded body can form an element that increases the mechanical strength and largely provides the strength of the carrier body. The semiconductor chip in particular is embedded in the molded body and hence in the carrier body.

The molded body can be made in particular in a molding process, for instance by injection molding, casting, press-forming, applying a film by lamination or the like. More preferably, the molded body can be formed by a transfer molding process, for instance by a film transfer molding process, or a compression molding process. If the light emitting semiconductor device comprises a plurality of light emitting semiconductor chips, then these can be embedded in a common carrier body, and hence a common molding part can be molded around said chips in one method step.

Document WO 2011/015449 A1, for instance, describes a method for producing a molded body such as described here, the disclosure of which document is included in full by reference.

According to another embodiment, the molded body is designed to be light-transmissive at least to some extent. In addition, it is also possible to design the molded body to be optically reflective at least to some extent. This can be achieved, for instance, by introducing optically reflective particles in a matrix material of the molded body, in particular one of the aforementioned materials for the molded body. At least some of the light exiting at the side faces of the light emitting semiconductor chip can then be reflected by the molded body.

According to another embodiment, a wavelength conversion element is arranged on the light outcoupling surface of the light emitting semiconductor chip. Said wavelength conversion element can be arranged on the light outcoupling surface before or after the molded body is molded around the semiconductor chip, and in particular can be formed by a layer containing one or more wavelength conversion materials. In case of a plurality of light emitting semiconductor chips in the carrier body, a common wavelength conversion element can be assigned to the semiconductor chips or, alternatively, a dedicated wavelength conversion element can be assigned to each of the semiconductor chips.

The wavelength conversion element in particular comprises at least one or a plurality of wavelength conversion materials suitable for converting at least some of the light emitted by the light emitting semiconductor chip or a plurality of light emitting semiconductor chips into a light of a different wavelength, with the result that the light emitting semiconductor chip can emit a mixed light composed of the primary light emitted by the semiconductor chip and the converted secondary light.

For example, a light emitting semiconductor chip can emit blue light, at least some of which is converted by a wavelength conversion element into green and red and/or yellow light, with the result that the semiconductor device can emit white light during operation. The wavelength conversion element can be applied, for instance, in the form of particles, which are embedded in a matrix material such as, for example, a plastics material, for instance silicone, or ceramic. The wavelength conversion element can be applied in this case as a film. In addition, it is also possible that the wavelength conversion element is embodied as a ceramic wafer, which contains the wavelength conversion material or is made of a ceramic wavelength conversion material. Furthermore, the wavelength conversion element can also comprise a diffuser material, for instance scattering particles, in order to adjust the optical or electro-optical properties. The wavelength conversion element can be applied in particular directly onto the light outcoupling surface.

According to another embodiment, at the light outcoupling surface of the semiconductor chip the carrier body has a top face on which a dielectric mirror is applied. In other words, this means that a material, which is designed to be both a dielectric, and hence electrical, insulator and reflective to light, is applied on the top face of the carrier body, i.e. beside the light outcoupling surface of the semiconductor chip in a lateral direction. In particular, the dielectric mirror is designed to be reflective to the light generated in the light emitting semiconductor chip during operation.

The light emitting semiconductor device described here is based on the consideration that for the design described here having the carrier body which comprises a molded body that is molded onto a light emitting semiconductor chip, a reflective component top face can increase the light coupled out of the light emitting semiconductor device. If metallic mirrors are used, however, electrical isolation is needed in particular at the chip edges in the current-carrying region in order to avoid short-circuits. Thus if metallic mirrors are used on the component top face, for the purpose of electrical isolation it is necessary to use dielectric materials such as "spin-on dielectrics", for example, so for instance organic dielectric materials such as varnish-based dielectrics. In addition, a metallic mirror exhibits aging effects. Since a dielectric mirror is used for the light emitting semiconductor device described here, a metallic mirror can be dispensed with, removing the associated aging risks. Furthermore, using a varnish-based dielectric, for instance, may mean it is also possible to dispense with passivation, which brings a cost benefit, it being possible to use a varnish-based dielectric in combination with the dielectric mirror described here.

According to another embodiment, the dielectric mirror comprises at least one inorganic dielectric material. In particular, the dielectric mirror can comprise at least two dielectric layers having different refractive indices. In this case, the dielectric mirror in particular can be in the form of what is known as a Bragg mirror, also known as a Distributed Bragg Reflector (DBR), which comprises a periodic sequence of at least two dielectric layers having different refractive indices. For example, a plurality of pairs of a first and second layer having different refractive indices can be arranged one above the other.

According to another embodiment, the inorganic dielectric material comprises an oxide, which is applied on the top face of the carrier body for instance by means of chemical vapor deposition (CVD), physical vapor deposition (PVD) or atomic layer deposition (ALD). More preferably, the inorganic dielectric material comprises one or more materials selected from silicon oxide, aluminum oxide, titanium oxide and tantalum oxide. The dielectric layers of the dielectric mirror have a layer thickness, in particular an optical layer thickness, that is obtained from the wavelength to be reflected and from the refractive index of the particular material being used. In particular, the dielectric layers can have an optical thickness of one quarter, or a multiple of one quarter, of the wavelength of the light generated in the light emitting semiconductor chip during operation. For the dielectric mirror to have a wideband reflective action, said mirror can also have more complicated layer structures.

According to another embodiment, the light emitting semiconductor device comprises an electrical semiconductor component. The electrical semiconductor component can be arranged in the carrier body in particular beside the light emitting semiconductor chip in a lateral direction. The electrical semiconductor component together with the light emitting semiconductor chip can be arranged in particular in the molded body of the carrier body. In the same way as it is molded around the light emitting semiconductor chip, the molded body can thereby be molded around the electrical semiconductor component, which comprises side faces, with the result that the molded body is directly attached to the side faces of the electrical semiconductor component in a positively-locking manner, and covers said component directly in a positively-locking manner, as described above for the light emitting semiconductor chip.

According to another embodiment, the electrical semiconductor component is in the form of a diode, in particular a protection diode. The electrical semiconductor component can be designed in particular to protect the light emitting semiconductor device and in particular to protect the light emitting semiconductor chip from electrostatic discharge (ESD) and hence can be in the form of an ESD protection diode. Such an ESD protection diode is connected in anti-parallel with the light emitting semiconductor chip in order to protect the light emitting semiconductor chip from high reverse-bias voltages across the light emitting semiconductor chip.

According to another embodiment, the electrical semiconductor component is arranged underneath the dielectric mirror. In other words, this means that the electrical semiconductor component is arranged under the dielectric mirror and hence is arranged in the molded body such that it is covered by said mirror.

According to another embodiment, the dielectric mirror is arranged on the entire top face of the light emitting semiconductor device, i.e. on the entire top face of the carrier body, with only the light outcoupling surface of the light emitting semiconductor chip or part of the light outcoupling surface of the light emitting semiconductor chip being clear of the dielectric mirror. Thus, viewed from above onto the top face of the carrier body and onto the light outcoupling surface of the light emitting semiconductor chip, the dielectric mirror can enclose the light emitting semiconductor chip in a lateral direction at least in part or entirely. If the light emitting semiconductor device has a wavelength conversion element on the light outcoupling surface of the light emitting semiconductor chip, then the dielectric mirror can accordingly enclose the wavelength conversion element in a lateral direction at least in part or entirely. In other words, at least part of the light outcoupling surface of the light emitting semiconductor chip can be left uncovered by the dielectric mirror. The dielectric mirror can hence comprise an opening, which is arranged over the light outcoupling surface and through which at least part of the light outcoupling surface can be seen when looking onto said surface. In addition, the entire light outcoupling surface can also be clear of the dielectric mirror, with the result that the opening in the dielectric mirror has at least an identical or larger cross-section compared with the light outcoupling surface. The cross-section is in this case the shape of the light outcoupling surface and respectively of the opening in the dielectric mirror when viewed from above onto the light outcoupling surface or onto the mirror.

According to another embodiment, an electrical connecting element, which connects the light outcoupling surface of the light emitting semiconductor chip and a top face of the electrical semiconductor component in an electrically conducting manner, is arranged on the top face of the carrier body. The electrical connecting element can be in particular a metallic layer, which makes an electrical contact between an electrical contact element on the light outcoupling surface of the light emitting semiconductor chip and the top face of the semiconductor component. The electrical semiconductor component can likewise for this purpose comprise an electrical contact element, for example in the form of an electrode layer, or it can make contact directly with the electrical connecting element. In particular, the light emitting semiconductor chip can comprise on the light outcoupling surface an electrical contact element, and the electrical semiconductor component can comprise on the top face an electrical contact element, said contact elements being connected together in an electrically conducting manner by the electrical connecting element. The electrical connecting element can comprise, for example, one or more of the following materials: copper, nickel, silver, gold, palladium, titanium, aluminum.

Furthermore, electrical contact elements and/or connecting elements for making contact with the light emitting semiconductor chip and the electrical semiconductor component can be present on the rear side of the light emitting semiconductor device, which side is on the opposite side from the light outcoupling surface of the light emitting semiconductor chip and the top face of the carrier body. For instance, on the rear face of the light emitting semiconductor chip, which face is on the opposite side from the light outcoupling surface, there can be an electrical contact element and/or an electrical connecting element, which can also extend to some extent over the molded body of the carrier body. On the rear side opposite the top face of the electrical semiconductor component there can likewise be an electrical contact element and/or an electrical connecting element, which likewise can extend at least to some extent over the underside of the carrier body.

According to another embodiment, the electrical connecting element is arranged between the dielectric mirror and the carrier body. In particular, the electrical connecting element can be in the form of a metallic layer, at least part of which is arranged directly on the carrier body, i.e. in particular directly on the molded body. In this case it can also be particularly advantageous if the electrical connecting element encloses the light emitting semiconductor chip in a lateral direction. More preferably, the electrical connecting element can in this case cover as large a surface area of the carrier body as possible, for example at least 70% or at least 80% or at least 90%, because the reflective effect of the dielectric mirror can be further increased by the electrical connecting element. Furthermore, the electrical connecting element can be covered entirely by the dielectric mirror, with the result that the electrical connecting element has no contact with the environment and is encapsulated by the dielectric mirror together with the carrier body. It can hence be possible to use materials for the electrical connecting element that react with substances from the environment, for instance with oxygen, moisture or other damaging materials, and thereby potentially degenerate.

According to another embodiment, the electrical connecting element is arranged on the dielectric mirror viewed from the carrier body. In this case it can be particularly advantageous if the electrical connecting element covers the minimum possible surface area on the dielectric mirror. The electrical connecting element can extend in particular between two vias, which are arranged over respective electrical contact elements of the light emitting semiconductor chip and of the electrical semiconductor component. The electrical vias can extend in particular through the dielectric mirror and be connected in an electrically conducting manner to the top face of the electrical semiconductor component and to the light outcoupling surface of the light emitting semiconductor chip, in particular to electrical contact elements thereon.

The electrical vias can comprise, for example, one or more of the materials described above for the electrical connecting element:

BRIEF DESCRIPTION OF THE DRAWINGS

Further advantages, advantageous embodiments and developments appear in the embodiments described below in connection with the figures, in which.

DETAILED DESCRIPTION OF ILLUSTRATIVE EMBODIMENTS

In each of the exemplified embodiments and figures, the same reference numbers may be used to denote identical, similar or equivalent elements. The elements shown and the relative sizes thereof shall not be considered to be to scale. Indeed, individual elements such as layers, component, devices and regions, for example, may be shown exaggeratedly large in order to improve visualization and/or understanding.

Figure 1A:
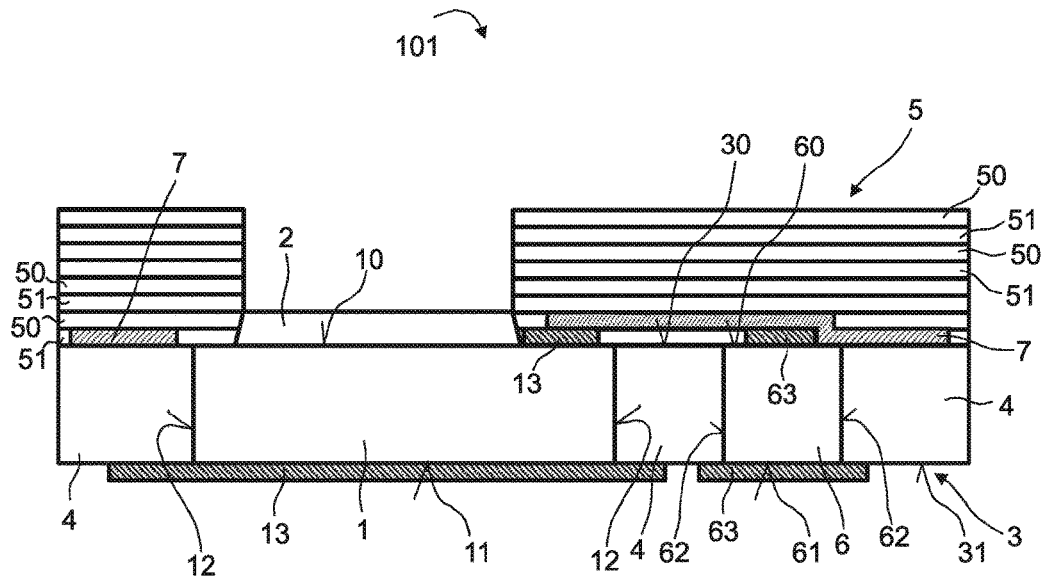
FIGS. 1A and 1B are schematic diagrams of views of a light emitting semiconductor device according to one embodiment.
Figure 1B:
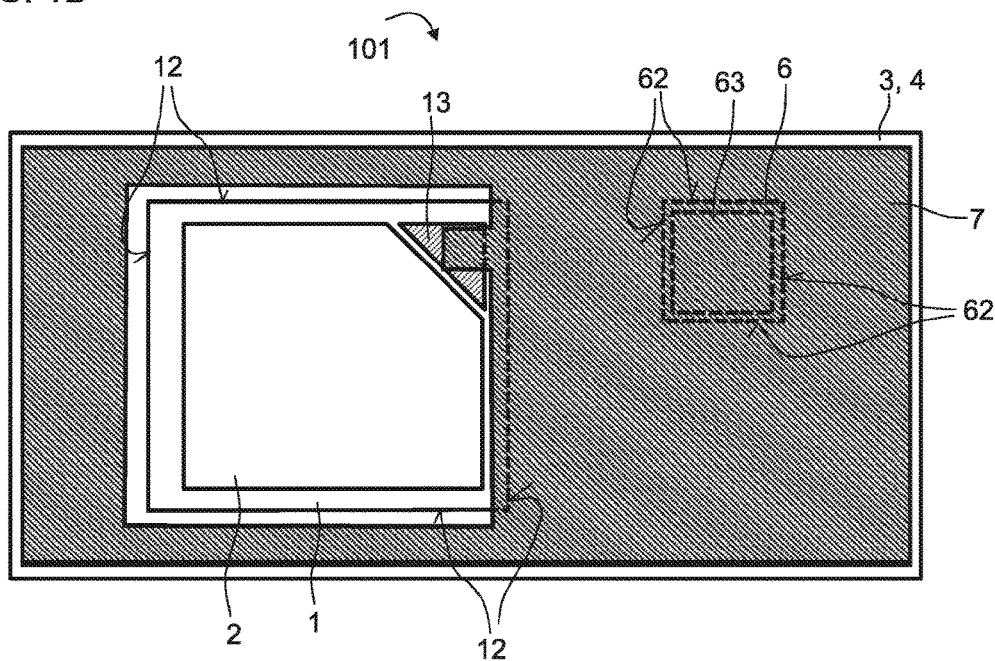

FIGS. 1A and 1B show an exemplified embodiment of a light emitting semiconductor device 101. FIG. 1A shows a cross-sectional view through the light emitting semiconductor device 101, whereas FIG. 1B shows a plan view of part of the light emitting semiconductor device 101.

The light emitting semiconductor device 101 comprises at least one light emitting semiconductor chip 1, which is designed to generate light during operation. For this purpose, the light emitting semiconductor chip 1 comprises a semiconductor layer sequence containing an active region, in which light is generated when current is injected into the light emitting semiconductor chip. The light emitting semiconductor chip 1 also comprises a light outcoupling surface 10, via which is emitted the light generated during operation. On the opposite side from the light outcoupling surface 10 is disposed a rear face 11 of the light emitting semiconductor chip 1. The light outcoupling surface 10 and the rear face 11 form two main surfaces of the light emitting semiconductor chip 1, which are connected together via side faces 12. In terms of the semiconductor layer sequence and also, for instance, in terms of a substrate, the light emitting semiconductor chip 1 can be designed as described above in the general part.

In the embodiment shown, a wavelength conversion element 2 is arranged on the light outcoupling surface 10 of the light emitting semiconductor chip 1, which element is designed to convert some of the light generated in the light emitting semiconductor chip 1 during operation into light of a different wavelength. This allows the light emitting semiconductor device 101 to emit mixed-color light such as white light, for instance, during operation. As an alternative to the embodiment shown, a wavelength conversion element can also be absent from the light outcoupling surface 10. Moreover, it is also possible that in addition or as an alternative to a wavelength conversion element 2, one or more optical elements such as a diffuser layer or a lens, for example, are arranged on the light outcoupling surface.

The light emitting semiconductor device 101 also comprises a carrier body 3, which comprises a molded body 4, which covers the side faces 12 of the light emitting semiconductor chip 1 directly in a form-fit. The molded body 4 can be molded onto the light emitting semiconductor chip 1 by a molding process described above in the general part, and can comprise, for example, a silicone, an epoxy or another material mentioned above in the general part. In the embodiment shown, the molded body 4 and hence the carrier body 3 have a height that equals the height of the light emitting semiconductor chip 1, with the result that a top face 30 of the carrier body 3 at the light outcoupling surface 10 of the light emitting semiconductor chip 1 is flush with said surface. Alternatively, the top face 30 of the carrier body 3 can also be arranged above or below the light outcoupling surface 10 of the light emitting semiconductor chip 1. In other words, the carrier body 3 can have a greater or smaller height than the light emitting semiconductor chip 1, wherein the molded body 4 does not cover the light outcoupling surface 10.

A dielectric mirror 5, which comprises an inorganic dielectric material, is applied to the top face 30 of the carrier body 3. In particular, the dielectric mirror 5 comprises at least two dielectric layers 50, 51 and, in the embodiment shown, has a periodic sequence of at least two dielectric layers 50, 51 having different refractive indices. Thus the dielectric mirror 5 is embodied as what is known as a Bragg mirror, in which the thickness and material of the individual dielectric layers 50, 51 are selected so as to achieve in combination a maximum possible reflectivity for the light generated in the light emitting semiconductor chip 1 during operation. The dielectric layers 50, 51 of the dielectric mirror 5 can comprise, for example, one or more materials selected from silicon oxide, aluminum oxide, titanium oxide and tantalum oxide.

The dielectric mirror 5 in particular is arranged over a large area on the top face 30 of the carrier body 3 and encloses the light outcoupling surface 10 of the light emitting semiconductor chip 1 in a lateral direction. In particular, the dielectric mirror 5 can even extend as far as the wavelength conversion element 2 and enclose this element in a lateral direction, as shown in FIG. 1A. Thus at least part of the light outcoupling surface 10 of the light emitting semiconductor chip 1 is clear of, and uncovered by, the dielectric mirror 5. The dielectric mirror 5 can comprise an opening, which is arranged over the light outcoupling surface 10 and through which at least part of the light outcoupling surface 10, or of the wavelength conversion element 2, if present, can be seen when looking onto said surface. In addition, the entire light outcoupling surface 10 of the entire wavelength conversion element 2 can also be clear of the dielectric mirror 5, with the result that the opening in the dielectric mirror 5 has at least an identical or larger cross-section compared with the light outcoupling surface 10 or the wavelength conversion element 2.

The light emitting semiconductor device 101 also comprises an electrical semiconductor component 6 in the carrier body 3, which like the light emitting semiconductor chip 1 is enclosed by the molded body 4 of the carrier body 3. For this purpose, the molded body 4 is molded onto the electrical semiconductor component 6 as it is onto the light emitting semiconductor chip 1, and covers the side faces 62 of the electrical semiconductor component 6 directly in a positively-locking manner. The electrical semiconductor component 6 in particular is in the form of a protection diode, preferably an ESD protection diode.

In order to make electrical contact with the rear sides 11, 61 of the light emitting semiconductor chip 1 and of the electrical semiconductor component 6, electrical contact elements 13, 63 are applied thereto, which elements moreover may also cover parts of the carrier body 3. Further electrical contact elements 13, 63 are present on the light outcoupling surface 10 and on a top face 60 of the electrical semiconductor component 6. These elements are connected in an electrically conducting manner by means of an electrical connecting element 7, which is arranged on the top face 30 of the carrier body 3. In particular, in the embodiment shown, the electrical connecting element 7, which is in the form of a metallic layer, is arranged underneath the dielectric mirror 5, i.e. between the carrier body 3 and the dielectric mirror 5. In this regard, FIG. 1B shows a plan view of the light outcoupling surface 10 of the light emitting semiconductor chip 1 and of the top face 30 of the carrier body 3, in which view the dielectric mirror 5 is not shown, and therefore the electrical connecting element 7 appears as the topmost layer. Dashed lines are used to indicate elements which lie underneath the electrical connecting element 7 and are hence not visible.

As is clear in particular from FIG. 1B, the electrical connecting element 7 preferably covers as large an area as possible of the top face 30 of the carrier body 3, allowing a further increase in the total reflectivity in conjunction with the dielectric mirror 5. The electrical connecting element 7 in particular can be arranged entirely underneath the dielectric mirror 5 and in this case, as shown in FIG. 1B, can be set back from an edge region of the carrier body 3, for example, with the result that the electrical connecting element 7 can be protected from gases in the environment by the dielectric mirror 5.

In order to make electrical contact with the top face of the light emitting semiconductor device, i.e. in particular with the electrical contact element 7 on the light outcoupling surface 10 of the light emitting semiconductor chip 1, the electrical connecting element 7 can also protrude in a subregion below the dielectric mirror 5. In addition, for example, another electrical connecting element can be present on the dielectric mirror 5, which element is connected in an electrically conducting manner to the electrical connecting element 7 by means of a via through the dielectric mirror 5.

Figure 2A:
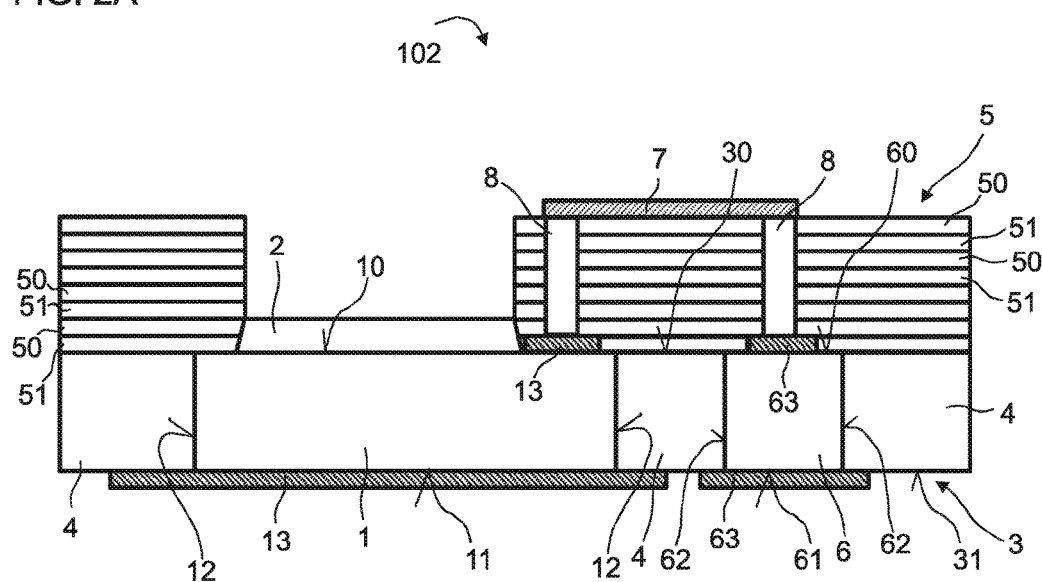
FIGS. 2A and 2B are schematic diagrams of views of a light emitting semiconductor device according to another embodiment.
Figure 2B:
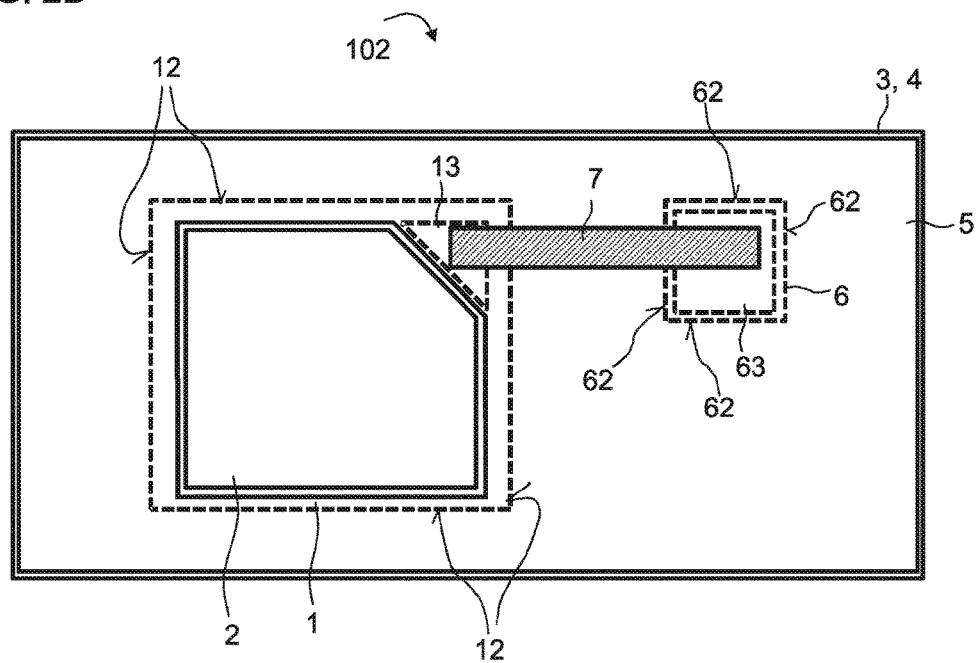

FIGS. 2A and 2B show another embodiment of a light emitting semiconductor device 102, which illustrates a modification of the embodiment of FIGS. 1A and 1B. The following description is therefore largely confined to the differences with respect to the previous embodiment.

The light emitting semiconductor device 102 in the embodiment of FIGS. 2A and 2B, unlike the light emitting semiconductor device 101 in the previous embodiment, comprises an electrical connecting element 7 that is arranged on the dielectric mirror 5, with the result that the dielectric mirror 5 is formed between the carrier body 3 and the electrical connecting element 7. In order to make electrical contact with the light emitting semiconductor chip 1 and the electrical semiconductor component 6, electrical vias 8 are present, which extend through the dielectric mirror 5 and which, in conjunction with the electrical connecting element 7, connect together in an electrically conducting manner the electrical contact elements 13, 63 on the light outcoupling surface 10 of the light emitting semiconductor chip 1 and on the top face 60 of the electrical semiconductor component 6. In this case it is particularly advantageous if the electrical connecting element 7 in the form of a metallic layer has a minimum possible surface area, as is shown in particular in the plan view in FIG. 2B, which unlike the plan view in FIG. 1B shows a plan view of the light emitting semiconductor device 102 including dielectric mirror 5. It can be seen particularly clearly here that the dielectric mirror 5 encloses the wavelength conversion element 2 in a lateral direction and covers as large an area as possible on the carrier body 3.

The embodiments shown in the figures can additionally or alternatively comprise further features described above in the general part.

The description based on the disclosed embodiments has no limiting effect on the invention. Instead, the invention includes every novel feature and every combination of features, which in particular includes every combination of features in the claims, even if this feature or combination is not itself explicitly mentioned in the claims or embodiments.

The invention claimed is:
1. A light emitting semiconductor device comprising:
at least one light emitting semiconductor chip having a semiconductor layer sequence, a light outcoupling surface, a rear face on an opposite side of the semiconductor layer sequence from the light outcoupling surface, and side faces which connect the light outcoupling surface and the rear face;
a carrier body, having a molded body which covers the side faces of the at least one light emitting semiconductor chip directly and in a positively-locking manner, wherein the carrier body comprises, at the light outcoupling surface of the at least one light emitting semiconductor chip, a top face on which a dielectric mirror is disposed, wherein at least part of the light outcoupling surface is uncovered by the dielectric mirror, wherein the dielectric mirror comprises a periodic sequence of at least two dielectric layers having different refractive indices, and wherein each of the at least two dielectric layers extends substantially parallel to the top face of the carrier body and to the light outcoupling surface;
a first component configured to electrically connect the top face of the carrier body to a rear face of the carrier body opposite the top face, wherein the first component is arranged in the carrier body and beside the at least one light emitting semiconductor chip, wherein the first component has side faces to which the molded body is directly attached in a positively-locking manner; and
an electrical connecting element arranged on the top face of the carrier body, wherein the electrical connecting element electrically connects the light outcoupling surface of the at least one light emitting semiconductor chip and a top face of the first component;
wherein the electrical connecting element is arranged between the dielectric mirror and the carrier body; and
wherein the electrical connecting element encloses the at least one light emitting semiconductor chip in a lateral direction.
2. The semiconductor device as claimed in claim 1, wherein the dielectric mirror comprises at least one inorganic dielectric material.
3. The semiconductor device as claimed in claim 1, wherein the dielectric mirror is a Bragg mirror.

4. The semiconductor device as claimed in claim 1, wherein the first component is a protection diode.

5. The semiconductor device as claimed in claim 1, wherein the first component is arranged under the dielectric mirror and is covered by the dielectric mirror.

6. The semiconductor device as claimed in claim 1, wherein the electrical connecting element is a metallic layer.

7. The semiconductor device as claimed in claim 1, wherein the at least one light emitting semiconductor chip comprises an electrical contact element on the light outcoupling surface, wherein the first component comprises a corresponding electrical contact element on the top face of the first component and wherein the contact element of the at least one light emitting semiconductor chip and the corresponding electrical contact element of the first component are electrically connected by the electrical connecting element.

8. The semiconductor device as claimed in claim 1, wherein the electrical connecting element is arranged on the dielectric mirror as viewed from the carrier body.

9. The semiconductor device as claimed in claim 8, wherein the electrical connecting element is electrically connected to the top face of the first component and to the light outcoupling surface of the light emitting semiconductor chip by electrical vias extending through the dielectric mirror.

10. The semiconductor device as claimed in claim 1, wherein the light outcoupling surface is free of coverage by the molded body.

11. The semiconductor device as claimed in claim 1, wherein the dielectric mirror covers the entire top face of the carrier body.

12. The semiconductor device as claimed in claim 1, wherein a wavelength conversion element is arranged on the light outcoupling surface.

13. The semiconductor device as claimed in claim 12, wherein the dielectric mirror encloses the wavelength conversion element in a lateral direction.

14. The semiconductor device as claimed in claim 1, wherein the at least one light emitting semiconductor chip comprises an electrical contact element on the light outcoupling surface, and wherein the dielectric mirror extends from the top face of the carrier body over the electrical contact element and covers the electrical contact element.

15. The semiconductor device as claimed in claim 1, wherein the light outcoupling surface of the at least one light emitting semiconductor chip is substantially level with the top face of the carrier body;
   wherein the dielectric mirror has a lowermost surface disposed above the top face of the carrier body and above the light outcoupling surface of the at least one light emitting semiconductor chip; and
   wherein at least a portion of the dielectric mirror extends laterally from directly over the top face of the carrier body, over one of the side faces of the at least one light emitting semiconductor chip that is covered by the carrier body, directly over the light outcoupling surface of the at least one light emitting semiconductor chip.

16. A light emitting semiconductor device comprising:
   at least one light emitting semiconductor chip having a semiconductor layer sequence, a light outcoupling surface, a rear face on an opposite side of the semiconductor layer sequence from the light outcoupling surface, and side faces which connect the light outcoupling surface and the rear face;
   a carrier body, having a molded body which covers the side faces of the at least one light emitting semiconductor chip directly and in a positively-locking manner;
   an electrical semiconductor component arranged in the carrier body; and
   an electrical connecting element arranged on a top face of the carrier body;
   wherein the carrier body has, at the light outcoupling surface of the at least one light emitting semiconductor chip, a dielectric mirror which is disposed on the top face of the carrier body, wherein at least part of the light outcoupling surface is uncovered by the dielectric mirror;
   wherein the electrical connecting element is arranged between the dielectric mirror and the carrier body and electrically connects the at least one light emitting semiconductor chip and the electrical semiconductor component; and
   wherein the electrical connecting element encloses the at least one light emitting semiconductor chip in a lateral direction.

17. A light emitting semiconductor device comprising:
   at least one light emitting semiconductor chip having a semiconductor layer sequence, a light outcoupling surface, a rear face on an opposite side of the semiconductor layer sequence from the light outcoupling surface, and side faces which connect the light outcoupling surface and the rear face; and
   a carrier body, having a molded body which covers the side faces of the at least one light emitting semiconductor chip directly and in a positively-locking manner;
   wherein the carrier body comprises, at the light outcoupling surface of the at least one light emitting semiconductor chip, a top face on which a dielectric mirror is disposed, wherein at least part of the light outcoupling surface is uncovered by the dielectric mirror;
   wherein the top face of the carrier body, the light outcoupling surface of the at least one light emitting semiconductor chip, and a surface of the dielectric mirror that is remote from the carrier body and from the light emitting semiconductor chip are substantially parallel; and
   wherein the at least one light emitting semiconductor chip comprises an electrical contact element on the light outcoupling surface, and wherein the dielectric mirror extends from the top face of the carrier body over the electrical contact element and covers the electrical contact element.

18. A light emitting semiconductor device comprising:
   at least one light emitting semiconductor chip having a semiconductor layer sequence, a light outcoupling surface, a rear face on an opposite side of the semiconductor layer sequence from the light outcoupling surface, and side faces which connect the light outcoupling surface and the rear face; and
   a carrier body, having a molded body which covers the side faces of the at least one light emitting semiconductor chip directly and in a positively-locking manner;
   wherein the carrier body comprises, at the light outcoupling surface of the at least one light emitting semiconductor chip, a top face on which a dielectric mirror is disposed, wherein at least part of the light outcoupling surface is uncovered by the dielectric mirror, wherein the dielectric mirror comprises a periodic sequence of at least two dielectric layers having different refractive indices, and wherein each of the at least two dielectric layers extends substantially parallel to the top face of the carrier body and to the light outcoupling surface; and wherein the at least one light emitting semiconductor chip comprises an electrical contact element on the light outcoupling surface, and wherein the dielectric mirror extends from the top face of the carrier body over the electrical contact element and covers the electrical contact element.

* * * * *